United States Patent [19]
Fazan et al.

[11] Patent Number: 5,043,780
[45] Date of Patent: Aug. 27, 1991

[54] DRAM CELL HAVING A TEXTURIZED POLYSILICON LOWER CAPACITOR PLATE FOR INCREASED CAPACITANCE

[75] Inventors: Pierre C. Fazan; Ruojia R. Lee, both of Boise, Id.

[73] Assignee: Micron Technology, Inc., Boise, Id.

[21] Appl. No.: 460,453

[22] Filed: Jan. 3, 1990

[51] Int. Cl.$^5$ .................... H01L 29/68; H01L 29/78; H01L 29/92
[52] U.S. Cl. .................... 357/23.6; 357/51; 357/59
[58] Field of Search .............. 357/23.6, 23.6 G, 59 R, 357/51

[56] References Cited

FOREIGN PATENT DOCUMENTS

| | | | |
|---|---|---|---|
| 52-69589 | 6/1977 | Japan | 357/51 |
| 56-94655 | 7/1981 | Japan | 357/23.6 |
| 59-61063 | 4/1984 | Japan | 357/23.6 |
| 60-152051 | 8/1985 | Japan | 357/51 |
| 1-42161 | 2/1989 | Japan | 357/51 |

OTHER PUBLICATIONS

Mine, T., et al., "Capacitance-Enhanced Stacked-Capacitor with Engraved Storage Electrode ...", Extended Abstracts of the 21st Conference on Solid State Devices and Materials, Tokyo, 1989, pp. 137–140.

*Primary Examiner*—Andrew J. James
*Assistant Examiner*—Sara W. Crane
*Attorney, Agent, or Firm*—Angus C. Fox, III; Stanley N. Protigal

[57] ABSTRACT

A DRAM cell having enhanced capacitance attributable to the use of a textured polycrystalline silicon storage-node capacitor plate. The present invention is particularly applicable to DRAM cells which employ a stacked-capacitor design, as such designs generally a conductively-doped polycrystalline silicon layer as the storage-node, or lower, capacitor plate. A poly texturization process imparts a three-dimensional texturized character to the upper surface of the storage-node plate. Texturization is accomplished by subjecting the storage-node plate layer to a wet oxidation step. Since oxidation at the crystal grain boundaries on the surface of the poly layer proceeds more rapidly than elsewhere, the surface becomes bumpy. When maximum texturization has been achieved, the overlying oxide is removed during a wet etch step. With texturization complete, a thin (70–100 angstroms thick) silicon nitride layer is deposited on top of the texturized poly layer, followed by the deposition of a second poly layer, which functions as the capacitor field plate. Since the nitride layer is thin in comparison to the bumps on the surface of the storage-node plate layer, capacitive area is substantially augmented. Cell capacitance can be increased approximately thirty percent using a storage-node plate so texturized.

5 Claims, 6 Drawing Sheets

DRAM CELL HAVING A TEXTURIZED POLYSILICON LOWER CAPACITOR PLATE FOR INCREASED CAPACITANCE

FIELD OF THE INVENTION

This invention relates to semiconductor technology and, more specifically, to the design of capacitors used in dynamic random access memory (DRAM) cells. The focus of the invention is a poly texturization technique for increasing the capacitance of a DRAM cell having a polysilicon storage node capacitor plate, without increasing cell area and without utilizing any additional masking steps.

BACKGROUND OF THE INVENTION

The memory cells of dynamic random access memories are comprised of two main components: a field-effect transistor and a capacitor. In DRAM cells utilizing a conventional planar capacitor (such as the one depicted in FIG. 1), far more chip surface area is dedicated to planar capacitor 11 than to field-effect transistor (FET) 12. The gate 13 of FET 12 and the word line 14 are formed from an etched polycrystalline silicon-1 layer. Bit line 15 connects with access-node junction 16. Capacitor 11 has a lower plate formed from the n+ silicon substrate extension 17 of storage-node junction 18 of FET 12. Upper capacitor plate (or field plate) 19 is formed from a layer of conductively-doped polycrystalline silicon. Substrate extension 17 is electrically insulated from upper plate 19 by a dielectric layer 20. Planar capacitors have generally proven adequate for use in DRAM chips up to the one-megabit level. However, planar capacitors constructed with conventional dielectric materials appear to be unusable beyond the one-megabit DRAM level. As component density in memory chips has increased, the shrinkage of cell capacitor size has resulted in a number of problems. Firstly, the alpha-particle component of normal background radiation will generate hole-electron pairs in the n+ silicon substrate plate of a cell capacitor. This phenomena will cause the charge within the affected cell capacitor to rapidly dissipate, resulting in a "soft" error. Secondly, as cell capacitance is reduced, the sense-amp differential signal is reduced. This aggravates noise sensitivity and makes it more difficult to design a sense-amp having appropriate signal selectivity. Thirdly, as cell capacitance is decreased, the cell refresh time must generally be shortened, thus requiring more frequent interruptions for refresh overhead. The difficult goal of a DRAM designer is therefore to increase or, at least, maintain cell capacitance as cell size shrinks, without resorting to processes that reduce product yield or that markedly increase the number of masking and deposition steps in the production process.

Several methods for providing adequate cell capacitance in the face of shrinking cell size are either in use or under investigation. Basically, the efforts fall into two categories. Efforts within the first category are aimed at creating complex three-dimensional capacitors; those within the second are aimed at improving the dielectric of the planar capacitor.

The three-dimensional technique currently receiving the most attention involves the creation of "trench" capacitors in the cell substrate. FIG. 2 depicts a DRAM cell having a typical trench capacitor 21. Similar in concept to planar capacitor 11 of FIG. 1, the trench is employed to provide greater plate area, and hence, greater capacitance. The lower plate 22 may be formed from the n+ doped silicon substrate or it may be formed from a polysilicon layer which lines a trench cut in the n+ doped silicon substrate. The upper plate 23 is formed from a layer of conductively-doped polycrystalline silicon. Lower plate 22 and upper plate 23 are electrically insulated with a dielectric layer 24. DRAM chips employing trench capacitors have been built by a number of European, Japanese and U.S. companies, including IBM Corporation, Texas Instruments Inc., Nippon Electric Company, Toshiba, Matsuchita and Mitsubishi Electric Corporation. There are several problems inherent in the trench design, not the least of which is trench-to-trench capacitive charge leakage which is the result of a parasitic transistor effect between trenches. Another problem is the difficulty of completely cleaning the capacitor trenches during the fabrication process; failure to completely clean a trench will generally result in a defective cell.

Another three-dimensional technique, which is being used by Mitsubishi Electric Company, Hitachi, and Fujitsu Ltd., is the stacking of capacitor plates between dielectric layers on the DRAM cell surface. FIG. 3 is a graphic representation of a typical DRAM cell having a stacked capacitor 31. The lower plate 32 is formed from an n-type polycrystalline silicon layer which is in contact with the silicon substrate 33 in the region of the FET storage-node junction, while the upper plate 34 is formed from a conductively-doped polycrystalline silicon layer. The two layers are separated by a dielectric layer 35. Lower plate 32 and upper plate 34 are both stacked on top of FET 12 and word line 36, resulting in a high-profile cell which requires more stringent process control for the connection of bit line 37 to access-node junction 38.

Alternatively, other schemes involve the use of ferroelectric materials for DRAM cell capacitor dielectrics. Since ferroelectric materials have a dielectric constant more than 100 times that of silicon oxides, the use of such materials has the potential for allowing the size of the DRAM-cell capacitor to be shrunk to one of the smaller cell elements without resorting to three-dimensional structures. Critics of ferroelectric materials point out that such materials suffer from a "wearout" mechanism. In addition, they warn that there are many chemical incompatibilities with the other materials used in integrated circuit fabrication and that the layering of ferroelectric films within integrated circuit structures has not yet been done successfully.

SUMMARY OF THE INVENTION

The present invention is applicable to DRAM cell designs, such as the stacked-capacitor design heretofore described or a poly-lined trench design, that utilize a conductively-doped polycrystalline silicon layer for the storage-node, or lower, capacitor plate. A poly texturization process is employed to create a three-dimensional texturized surface on the upper surface of the storage-node plate. Texturization is accomplished by subjecting the storage-node plate layer to a wet oxidation step. Since oxidation at the crystal grain boundaries on the surface of the poly layer proceeds more rapidly than elsewhere, the surface becomes bumpy. When maximum texturization has been achieved, the overlying oxide is removed during a wet etch step. With texturization complete, a thin (70-100 angstroms thick) silicon nitride layer is deposited on top of the texturized poly layer, followed by the deposition of a second poly layer, which functions as the capacitor field plate. Since the nitride layer is thin in comparison to the bumps on the surface of the storage-node plate layer, capacitive area is substantially augmented. Cell capacitance can be increased approximately thirty percent using a storage-node plate so texturized.

FIG. 4 is a photomicrograph, taken with a scanning electron microscope at 50,000 X, of a polycrystalline silicon layer, the upper surface of which has been texturized by a wet oxidation step followed by a wet etch step. At this power of magnification, the surface appears as though it is made of gravel.

This polysilicon texturization process was developed by Richard Simko to increase injection current to and from a floating gate conductor component during write and erase operations of electrically-erasable, programmable, read-only memories (EEPROMs) manufactured by Xicor, Inc. The process is covered by a U.S. patent entitled "Nonvolatile Static Random Access Memory Devices" and numbered 4,300,212. Simko determined that the texturization pattern created on the polysilicon layer using his process consisted of asperities having an areal density of about $5 \times 10^9/cm^2$, an average base width of approximately 456 Å and an average height of approximately 762 Å. process was developed by Xicor, Inc. as a means to increase electron injection during write and erase operations in electrically-erasable programmable read-only memory (EEPROM) cells. During EEPROM construction, texturization is followed by thermal oxidation of the texturized surface. The bumps on the surface of the poly create regions of increased electric field strength, which both lowers breakdown voltage of the thermally-grown oxide and enhances current leakage by several orders of magnitude. The thermal oxide thus functions as a tunneling layer. Because conduction in silicon dioxide is electrode limited, generally considered to be in accordance with what is known as the Fowler-Nordheim mechanism, the use of thin layers of silicon dioxide as a DRAM cell dielectric between two roughened surfaces is precluded. However, because conduction in silicon nitride is bulk limited, most likely in accordance with what is known as the Frankel-Poole mechanism, silicon nitride is a much more suitable thin layer dielectric for use in DRAMs where capacitive layers are not smooth.

BRIEF DESCRIPTION OF THE DRAWINGS

FIGS. 1 through 3 depict existing technologies, while FIGS. 4 through 11 depict the fabrication of a DRAM array having a capacitor design conforming to the present invention.

FIG. 1 is a cross-sectional view of a DRAM cell having a conventional planar capacitor;

FIG. 2 is a cross-sectional view of a DRAM cell having a typical trench capacitor;

FIG. 3 is a cross-sectional view of a DRAM cell having a typical stacked capacitor;

FIG. 4 is a photomicrograph, taken with a scanning electron microscope at 50,000 X, of a texturized polycrystalline silicon layer;

FIG. 5 is a cross-sectional view of a DRAM cell of the stacked-capacitor design type during the fabrication process and subsequent to the deposition of the storage-node poly layer;

FIG. 6 is a cross-sectional view of the DRAM cell of FIG. 5 following a wet oxidation of the storage-node poly layer;

FIG. 7 is a cross-sectional view of the DRAM cell of FIG. 6 following a wet oxide etch which removes oxide that accumulated on the storage-node poly layer during the wet oxidation step;

FIG. 8 is a cross-sectional view of the DRAM cell of FIG. 7 following patterning of the storage-node poly layer;

FIG. 9 is a cross-sectional view of the DRAM cell of FIG. 8 following the blanket deposition of a silicon nitride layer, the blanket deposition of a polysilicon cell plate layer, and the masking of the cell plate layer; and FIG. 10 is a cross-sectional view of the DRAM cell of FIG. 9 following the etching of the poly cell plate layer.

DETAILED DESCRIPTION OF THE PREFERRED EMBODIMENT

Figure 1:
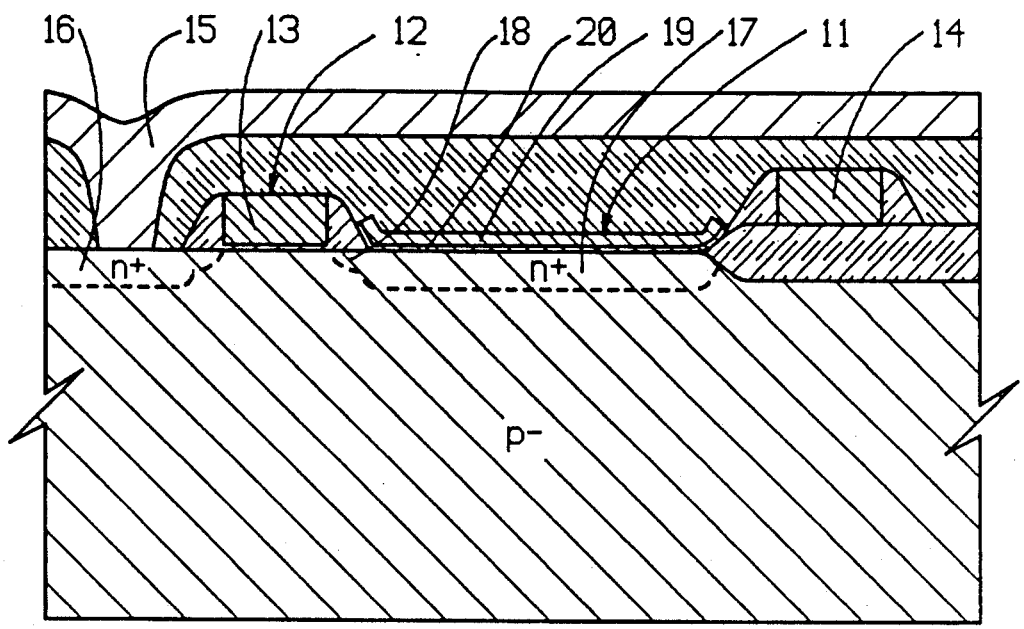
Figure 2:
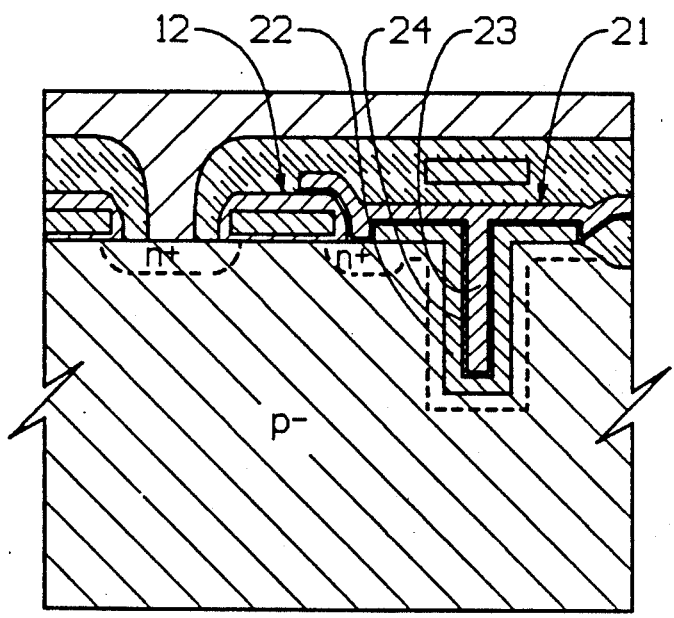
Figure 3:
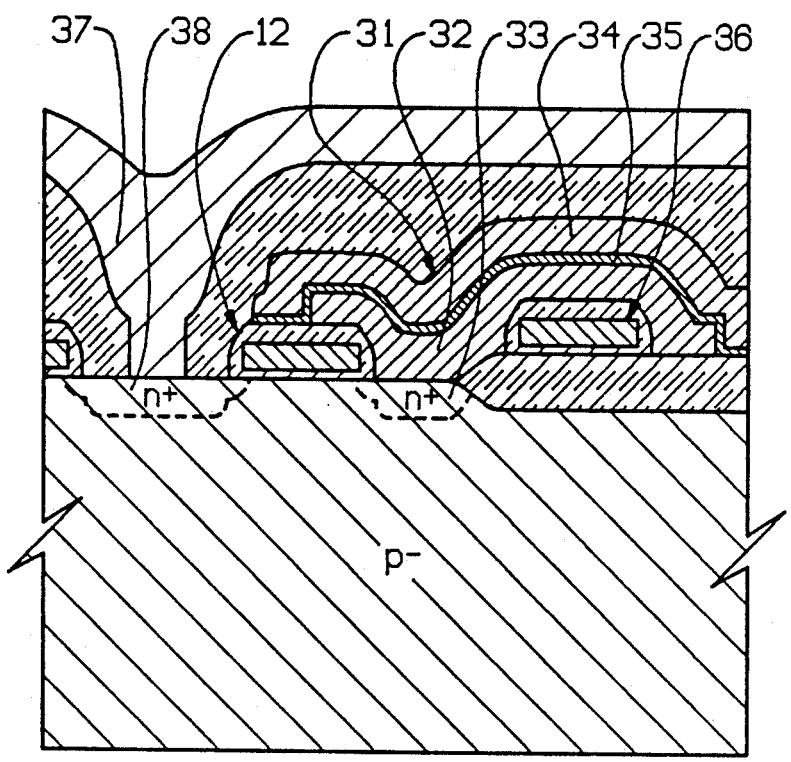
Figure 4:
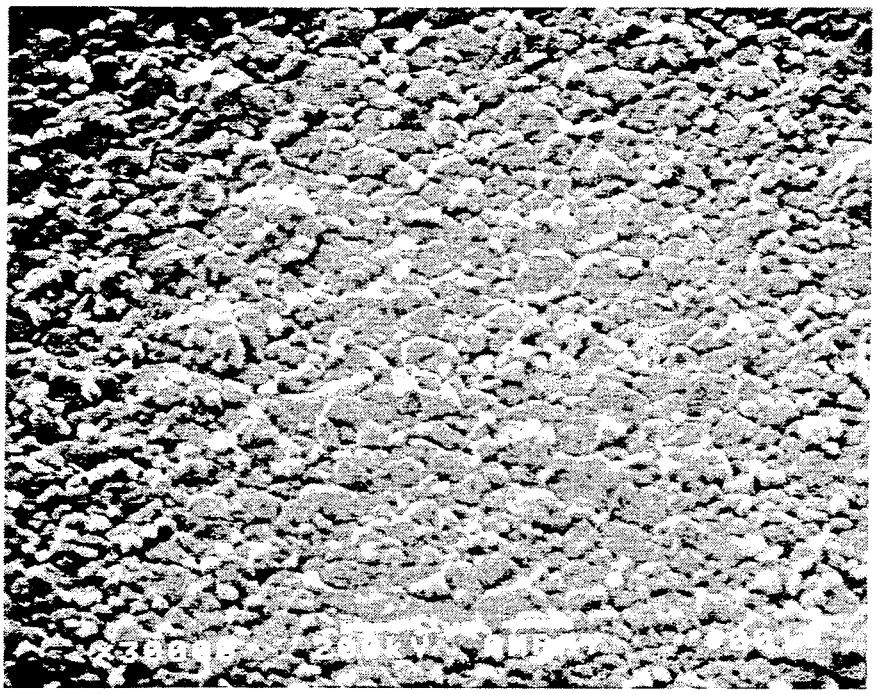
Figure 5:
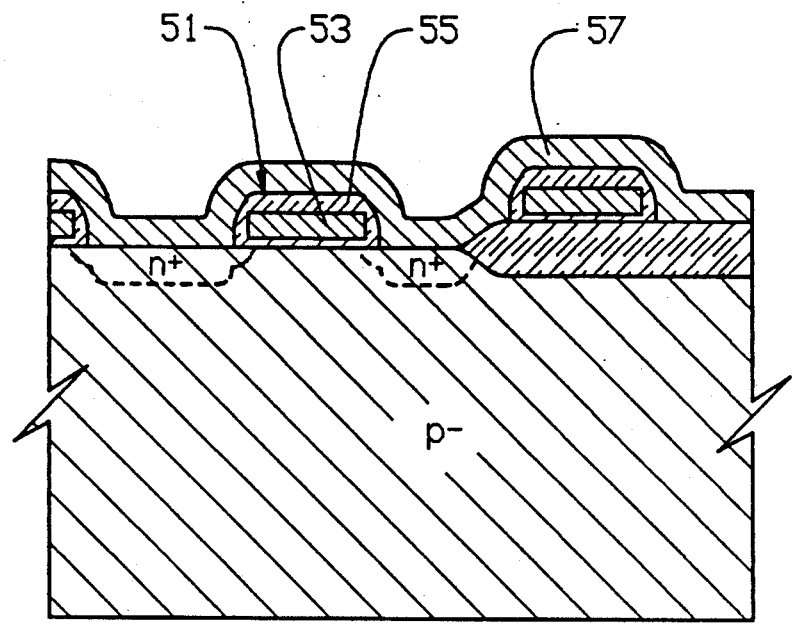

Referring now to FIG. 5, a DRAM cell of stacked-capacitor design is shown during the early stages of the fabrication process. The cell's field effect transistor (FET) 51 has already been formed. The FET gate 53, formed from a poly-1 layer, is covered on the top and sides by a silicon oxide spacer layer 55. A poly-2 layer 57, from which will be formed the cell's storage-node capacitor plate has been deposited over the surface of the cell. Poly-2 layer 57 is then conductively doped with phosphorus.

Figure 6:
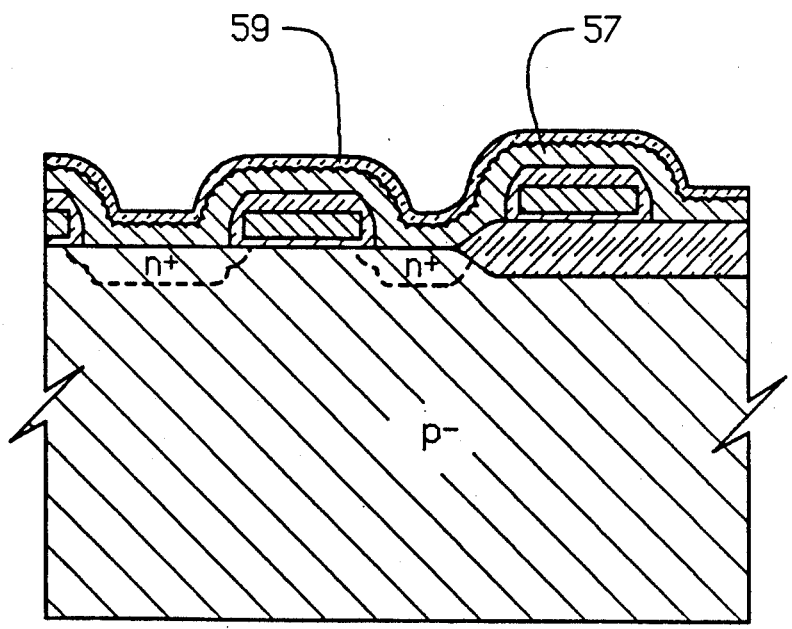

Referring now to FIG. 6, poly-2 layer 57 has been subjected to a wet oxidation step, which has created a multitude of bumps on the surface of poly-2 layer 57. Conductive doping of Poly-2 layer 57 was done prior to the wet oxidation step because the oxidation proceeds more rapidly at polysilicon crystal boundaries when the material is doped. In addition, the wet oxidation process has created an intermediate oxide layer 59 which covers the now-texturized poly-2 layer 57. It will be noted that poly-2 layer 57 is non-planar, and that texturization of poly-2 layer 57 has occurred equally well on both horizontal and non-horizontal portions thereof.

Figure 7:
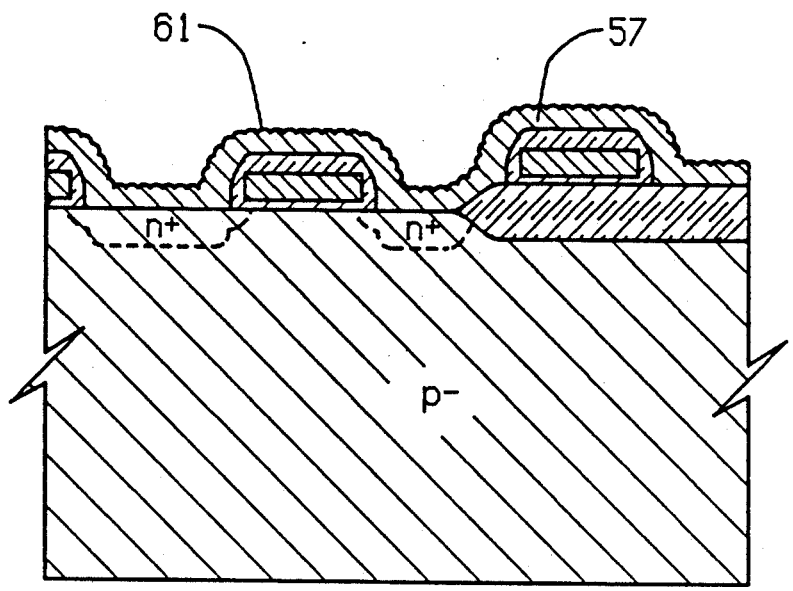

Referring now to FIG. 7, a wet oxide etch has removed intermediate oxide layer 59 which covered poly-2 layer 57, thus exposing the texturized surface 61 of poly-2 layer 57.

Figure 8:
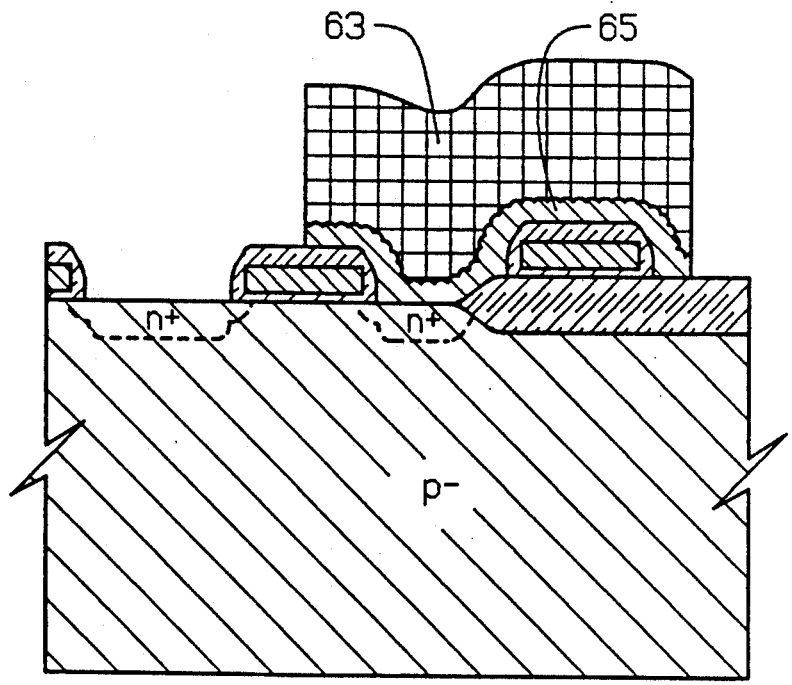

Referring now to FIG. 8, poly-2 layer 57 has been masked with first photomask 63 and etched (patterned) to form the cell's storage-node capacitor plate 65.

Figure 9:
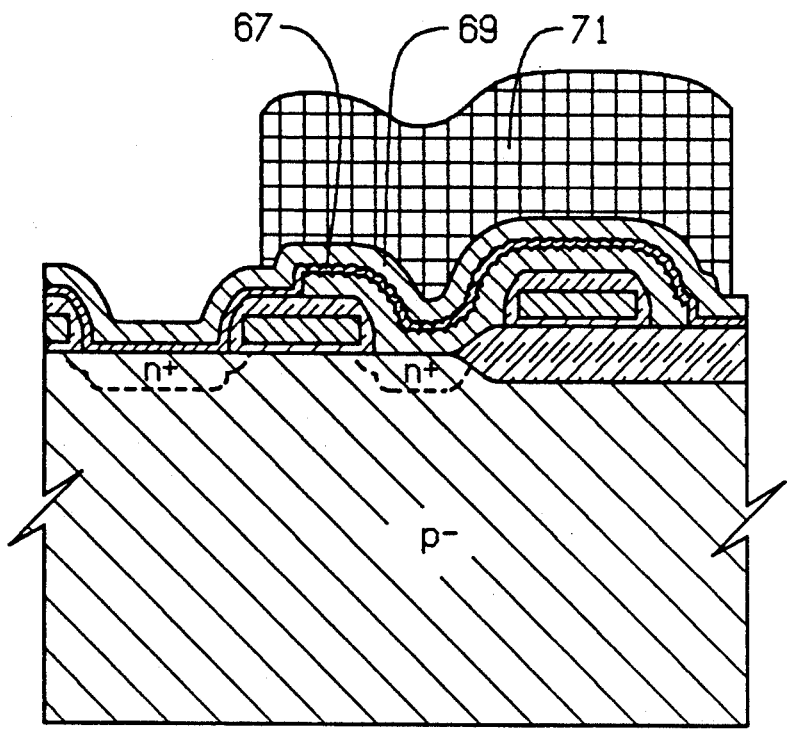

Referring now to FIG. 9, photomask 63 has been removed and the blanket deposition of a 100-Angstrom-thick silicon nitride layer 67 has taken place, followed by the blanket deposition of a poly-3 layer 69, conductive doping of poly-3 layer 69 with phosphorus, and the masking of poly-3 layer with second photomask 71.

Figure 10:
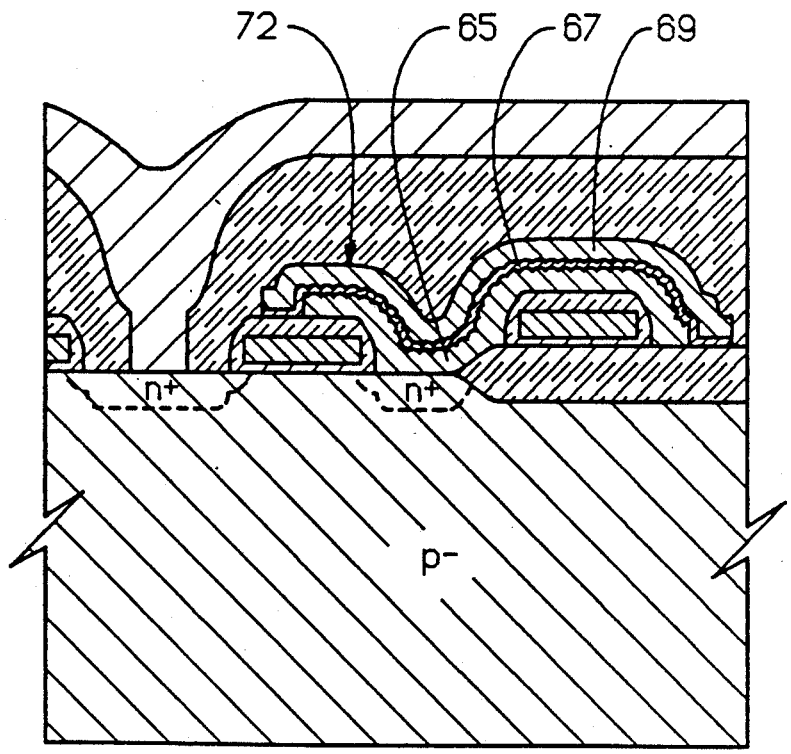

Referring now to FIG. 10, poly-3 layer 69 and silicon nitride layer 67 have been etched, forming a cell plate 72, which functions as the cell capacitor's field plate, being dielectrically insulated from storage-node capacitor plate 65 by silicon nitride layer 67.

Although only a single embodiment of the invention has been described herein, it will be apparent to one skilled in the art that changes and modifications may be made thereto without departing from the spirit and the scope of the invention as claimed.

I claim:

1. An enhanced-capacitance DRAM cell comprising:
   a field effect transistor (FET) constructed on a silicon substrate, a first portion of said substrate being conductively doped to function as the FET's access-node junction and a second portion of said substrate being conductively doped to function as the FET's storage-node junction;

a storage capacitor, said capacitor having
- a first conducively-doped polycrystalline silicon (poly) layer which functions as a storage-node capacitor plate, said first poly layer having a lower surface in contact with the storage-node junction, and a randomly texturized upper surface, said texturized surface consisting of a multiplicity of asperities, each asperity corresponding to an exposed, individual silicon crystal within said first poly layer,
- a bulk-limited-conduction-type dielectric layer having lower and upper surfaces, the texturized upper surface of the first poly layer being in contact at all points with the lower surface of said dielectric layer which is substantially conformal with the texturized upper surface of said first poly layer, and
- a second conductively-doped poly layer having lower and upper surfaces, said lower surface being in contact with the upper surface of said dielectric layer and being substantially conformal thereto.

2. The enhanced-capacitance DRAM cell of claim 1, wherein said asperities have an areal density of about $5 \times 10^9/cm^2$, an average base width of approximately 456 Å and an average height of approximately 762 Å.

3. The enhanced-capacitance DRAM cell of claim 1, wherein said asperities cover the entire upper surface of said first poly layer.

4. The enhanced-capacitance DRAM cell of claim 1, wherein said first poly layer is non-planar.

5. The enhanced-capacitance DRAM cell of claim 1, wherein said non-planar first poly layer has certain portions thereof that form an acute angle with the wafer substrate, said acute angle falling within a range of between 45 to 90 degrees.

* * * * *

UNITED STATES PATENT AND TRADEMARK OFFICE
CERTIFICATE OF CORRECTION

PATENT NO. : 5,043,780
DATED : August 27, 1991
INVENTOR(S) : Pierre C. Fazan et al.

It is certified that error appears in the above-indentified patent and that said Letters Patent is hereby corrected as shown below:

Column 3, lines 26-29, please delete "process was developed by Xicor, Inc. as a means to increase electron injection during write and erase operations in electrically-erasable programmable read-only memory (EEPROM) cells."

Signed and Sealed this

Fourth Day of January, 1994

Attest:

BRUCE LEHMAN

Attesting Officer           Commissioner of Patents and Trademarks